(12) United States Patent
Bensing et al.

(10) Patent No.: US 7,598,760 B1
(45) Date of Patent: Oct. 6, 2009

(54) HIGH TEMPERATURE CERAMIC DIE PACKAGE AND DUT BOARD SOCKET

(75) Inventors: Thomas G. Bensing, Sunnyvale, CA (US); Adalberto M. Ramirez, Hayward, CA (US); Jens Ullmann, San Jose, CA (US); Jacob Herschmann, Palo Alto, CA (US); Robert J. Sylvia, Santa Clara, CA (US); Maurice C. Evans, Oakland, CA (US)

(73) Assignee: Qualitau, Inc., Sunnyvale, CA (US)

( * ) Notice: Subject to any disclaimer, the term of this patent is extended or adjusted under 35 U.S.C. 154(b) by 0 days.

(21) Appl. No.: 12/124,935

(22) Filed: May 21, 2008

(51) Int. Cl.
*G01R 31/02* (2006.01)
(52) U.S. Cl. .................. 324/755; 361/802
(58) Field of Classification Search .......... None
See application file for complete search history.

(56) References Cited

U.S. PATENT DOCUMENTS 6,049,975 A * 4/2000 Clayton .................. 29/832
6,191,474 B1 * 2/2001 Kinsman et al. .......... 257/693

OTHER PUBLICATIONS

International Search Report in corresponding PCT application No. PCT/US09/44676, mailed Jul. 6, 2009.
Written Opinion in corresponding PCT application No. PCT/US09/44676, mailed Jul. 6, 2009.

* cited by examiner

*Primary Examiner*—Minh N Tang
(74) *Attorney, Agent, or Firm*—Beyer Law Group LLP

(57) ABSTRACT

A strip-shaped package is provided that can accept a single die up to many dice. Conduction paths are printed (or otherwise integrally formed) thereon to the edge of the package, and a complementary socket may be provided that, in combination with the strip-shaped package, provides for electrical connection to test electronics without the use of package leads. The strip-shaped package may be made of ceramic or other temperature resistant material. The strip-shaped package may have at least one "well" location in which the die or dice may be affixed to the strip-shaped package. The strip may have notches configured to function as separators between the individual die housings (and related integrally-formed conduction paths).

8 Claims, 5 Drawing Sheets

HIGH TEMPERATURE CERAMIC DIE PACKAGE AND DUT BOARD SOCKET

BACKGROUND

The present invention is in the field of test die packaging solutions for reliability and parametric testing. In particular, the present invention relates to a system including a strip-shaped package to hold a die, and a socket to accept the package such that the die is both mechanically and electrically coupled to test equipment for the reliability and parametric testing.

Conventional test die packaging solutions for reliability and parametric testing utilize expensive and complicated vessels that can be mated with many industry standard socket solutions. For example, common socket solutions accept either 300 mil or 600 mil width packages, can range anywhere from four pins to greater than 40 pins, and are composed of ceramic materials for high temperature testing and plastic materials for non temperature accelerated testing.

Conventional packaging solutions, in the most common cases, also only allow the mounting of a single die per package. This single die per package configuration not only adds to the high cost of the overall testing process, but also results in a relatively large amount of waste. Although some users will recycle the ceramic packages when testing at low temperatures (such as below 125° C.), many users are leery of the practice, due to the unknown reliability of the package connection and bonding combination. It is likely no users will recycle packages used during high temperature testing, and even when the user intends and desires to recycle the packages, it is not always possible to do so due to the ease with which the packages may be damaged in use.

We now refer to FIG. 1 and describe a conventional package level testing apparatus 100 that utilizes a dual in-line package configuration. The package normally includes a single die 102 that can, in turn, include many different test structures or devices. Certain points on the die 102 are connected electrically, such as by bonding, to the conduction paths 104 on the package 105. The conduction paths 104 on the package 105 are electrically connected to the leads 106 of the package, which, once inserted into a socket (not shown in FIG. 1), are the normal contact points between the bonding of the die and the socket.

Among other things, the socket acts as an interface between a package and a piece of test equipment referred to as "Device Under Test board (DUT board)". For example, the socket may be permanently affixed to the DUT board, which enables the populated package (e.g., configured such as shown in FIG. 1) to be flexibly mated to and unmated from the DUT board.

FIG. 2 shows a conventional socket 202 configured to accept a conventional dual in-line package 204, such as that shown in FIG. 1, populated with a die 206. There are many different solutions for this type of socket. For example, the socket 202 shown in FIG. 2 is configured to accept both 300 mil and 600 mil type packages. Although there are many different conventional sockets, suitable for various temperatures, high insertion force to zero insertion force, 300 mil to 600 mil and an endless range of pin numbers, the ones used in reliability/parametric testing are generally based on an industry standard dual in-line package (DIP) configuration as shown.

SUMMARY

In accordance with an aspect, use of the relatively expensive and complex package mentioned above may be avoided, whereas a multiple die, robust and inexpensive package and socket solution may be used.

Thus, for example, in one embodiment, a strip-shaped package is provided that can accept a single die up to many dice. The strip-shaped package may be as easy, if not easier, to bond to as conventional package solutions, easily recyclable yet inexpensive enough to be disposable, and can withstand a great deal of abuse before becoming unusable. In addition, conduction paths may be printed (or otherwise integrally formed) thereon to the edge of the package, and a complementary socket may be provided that, in combination with the strip-shaped package, provides for electrical connection to test electronics without the use of package leads. This improves on connectivity issues that plague many of the current socket designs, such as by the socket accepting a wide range of strip-shaped package widths while itself maintaining a uniform width.

In one embodiment, the strip-shaped package is a strip made of ceramic or other temperature resistant material. The strip-shaped package may have at least one "well" location in which the die or dice may be affixed to the strip-shaped package. The strip may have notches configured to function as separators between the individual die housings (and related integrally-formed conduction paths).

DETAILED DESCRIPTION

We now describe some detailed examples of strip-shaped packages and sockets that, in combination, are configured to interface to one or more dice to a DUT board for reliability and parametric testing.

Figure 1:
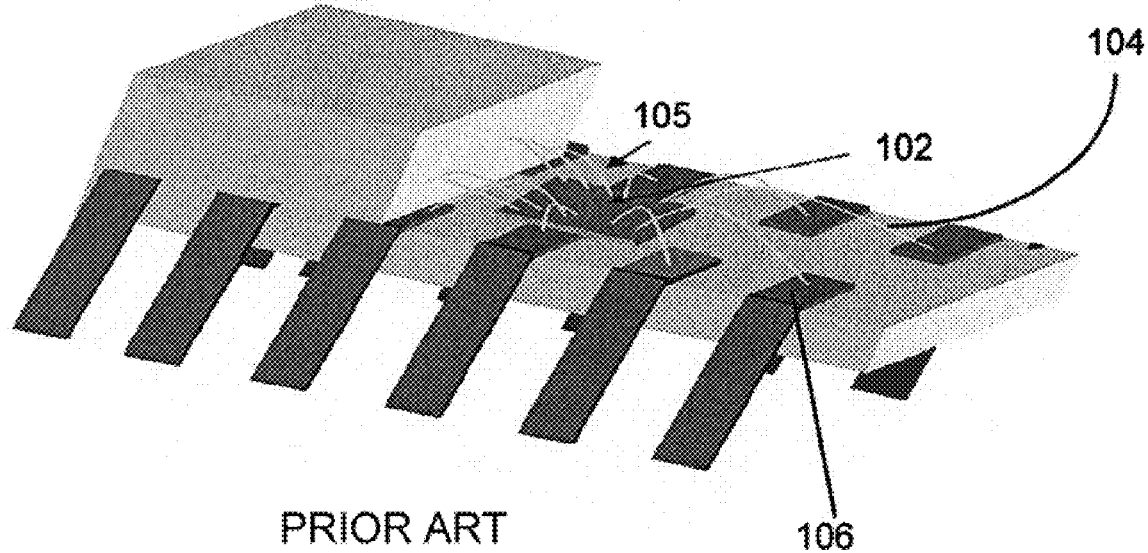
FIG. 1 illustrates a conventional package level testing apparatus that utilizes a dual in-line package configuration.
Figure 2:
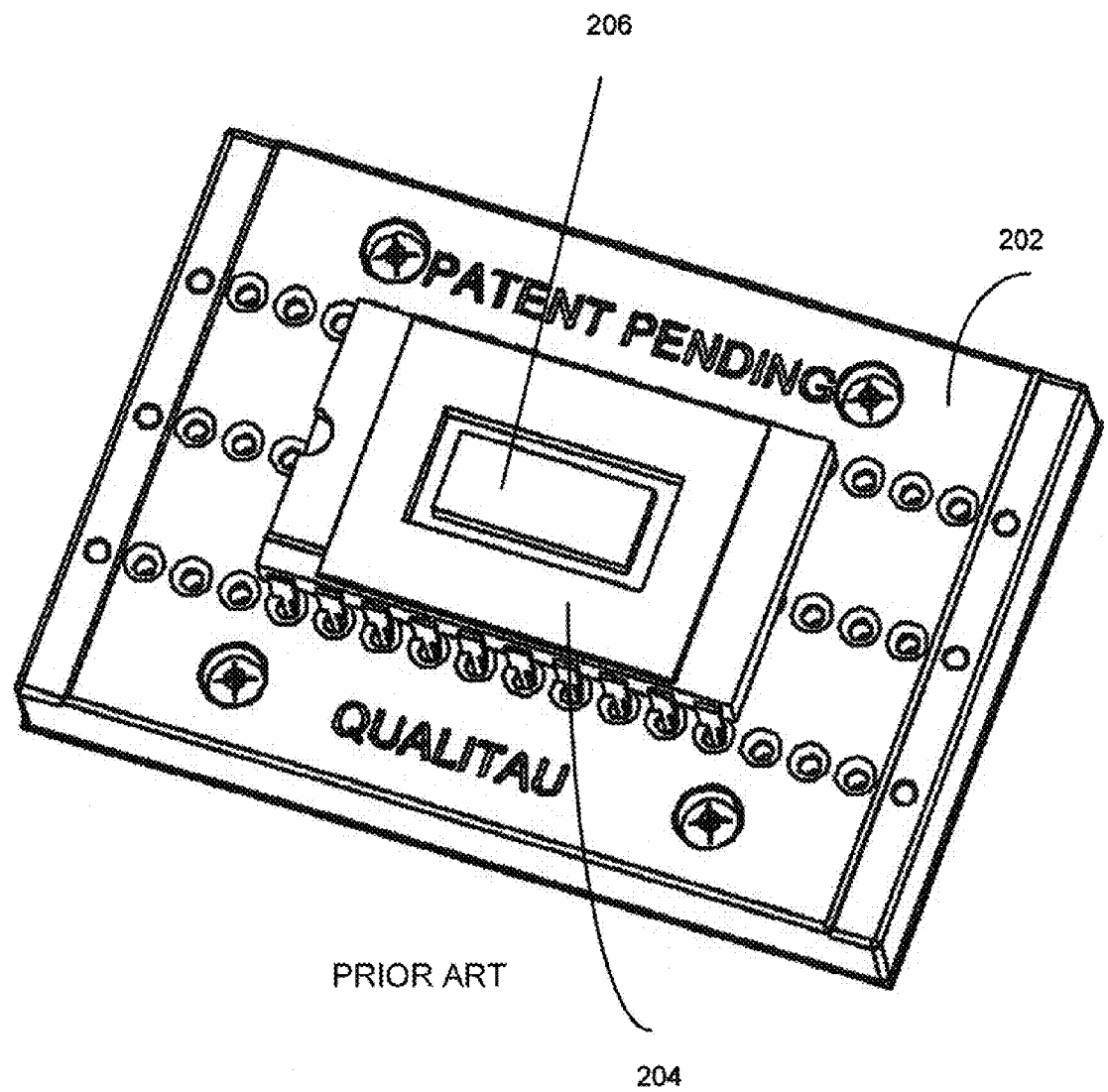
FIG. 2 shows a conventional socket configured to accept a conventional dual in-line package, such as that shown in FIG. 1, populated with a die.
Figure 3B:
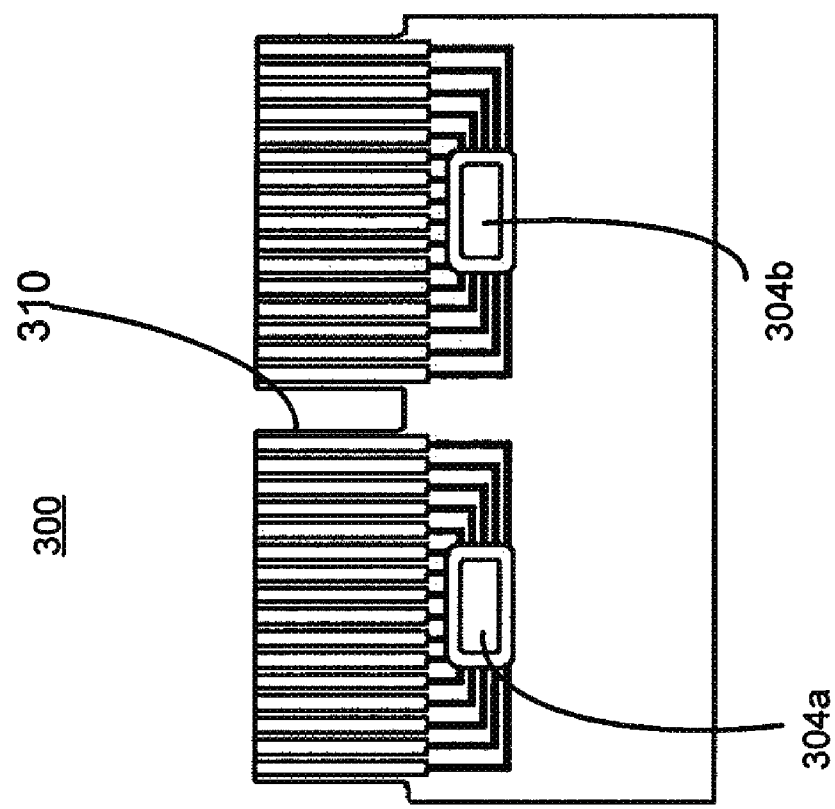
FIGS. 3a and 3b show a strip-shaped package with printed conduction paths to an edge of the package.
Figure 3A:
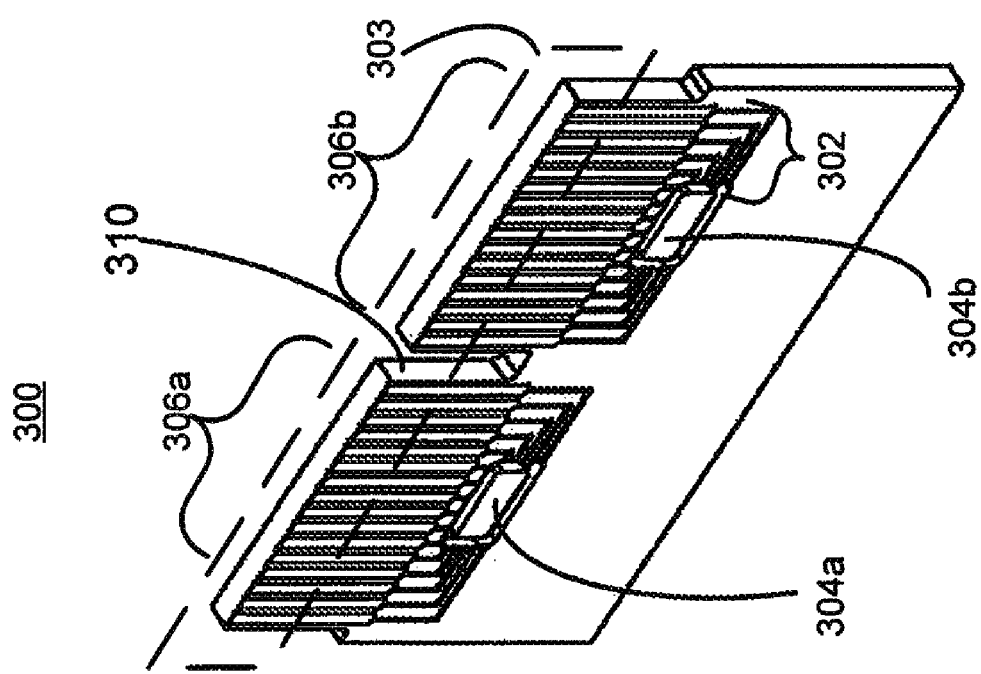

FIGS. 3a and 3b show a strip-shaped package 300 with printed conduction paths 302 to an edge 303 of the package 300. The printing of conduction paths 302 may be a process that is common process in the industry, and, as the name would imply, may be simply the process of printing a conductive material, such as gold, onto the face of a substrate material of the package 300. Depending on the material, the package may be reliably reused even after many high temperature cycles. Furthermore, after use, the printed conductive material of which the conduction paths are comprised may be cleaned off the package and new conduction paths may be printed according to a user definition.

In the example of FIGS. 3a and 3b, two wells 304a and 304b are provided, each configured to receive a die bonded therein. The wells 304a and 304b are formed such that a uniform "die to top of ceramic" height is maintained. This allows the interface at which a die is adhered to the package 300 to remain parallel to the face of the package 300. In use, points on the die are connected electrically, such as by bonding, to the conduction paths 302 of the package 300.

One or more notches (one notch 310 is shown in FIGS. 3a and 3b) may be provided to facilitate flexibility of package 300 width. For instance, in FIGS. 3a and 3b, the strip-shaped package is two "units" wide, where the units are denoted as 306a and 306b separated by the notch 310. Each unit includes one die well (e.g., unit 306a contains die well 304a, and unit 306b contains die well 304b) and respective associated conduction paths.

Figure 4:
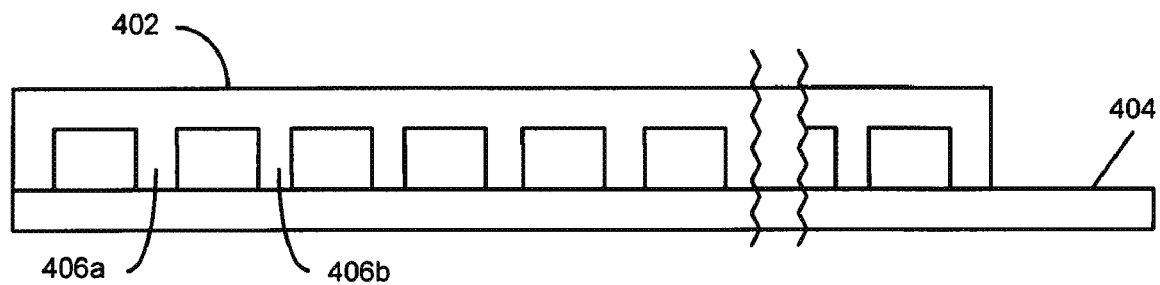
FIG. 4 is a cross-sectional drawing illustrating a socket bonded or otherwise coupled to a DUT board.

As illustrated in the FIG. 4 cross-sectional drawing, a socket 402 may be bonded or otherwise coupled to a DUT board 404. The socket 402 may be made from a material that can withstand high temperatures. In general, a suitable material for the socket 402 is one that reflects the need of the temperature requirements of a given test. Separators 406a, 406b, . . . , 406n correspond to complementary notches (such as the notch 310) in the strip-shaped packages at regular spacing to form the "unit" width discussed above with respect to FIG. 3. Thus, for example, if a socket is configured to accept a maximum package width of six units, the user has the flexibility to use strip-shaped packages of any width between one and six units or any combination of units that add up to no more than six units.

The notches in a strip-shaped package are configured in conjunction with the separators of a complementary socket facilitate alignment of the conductive paths on the packages with complementary conductive paths on a DUT on which the socket is mounted, particularly in situations where the total number of package units is less than the maximum number of units that can be accommodated by the socket/board combination. For example, if a socket is configured to accept a maximum package width of six units, and the user desires to use strip-shaped packages having only single unit widths, six single unit strip-shaped packages could be mated with the socket and the traces on the packages would align with the contacts on the socket.

Figure 5A:
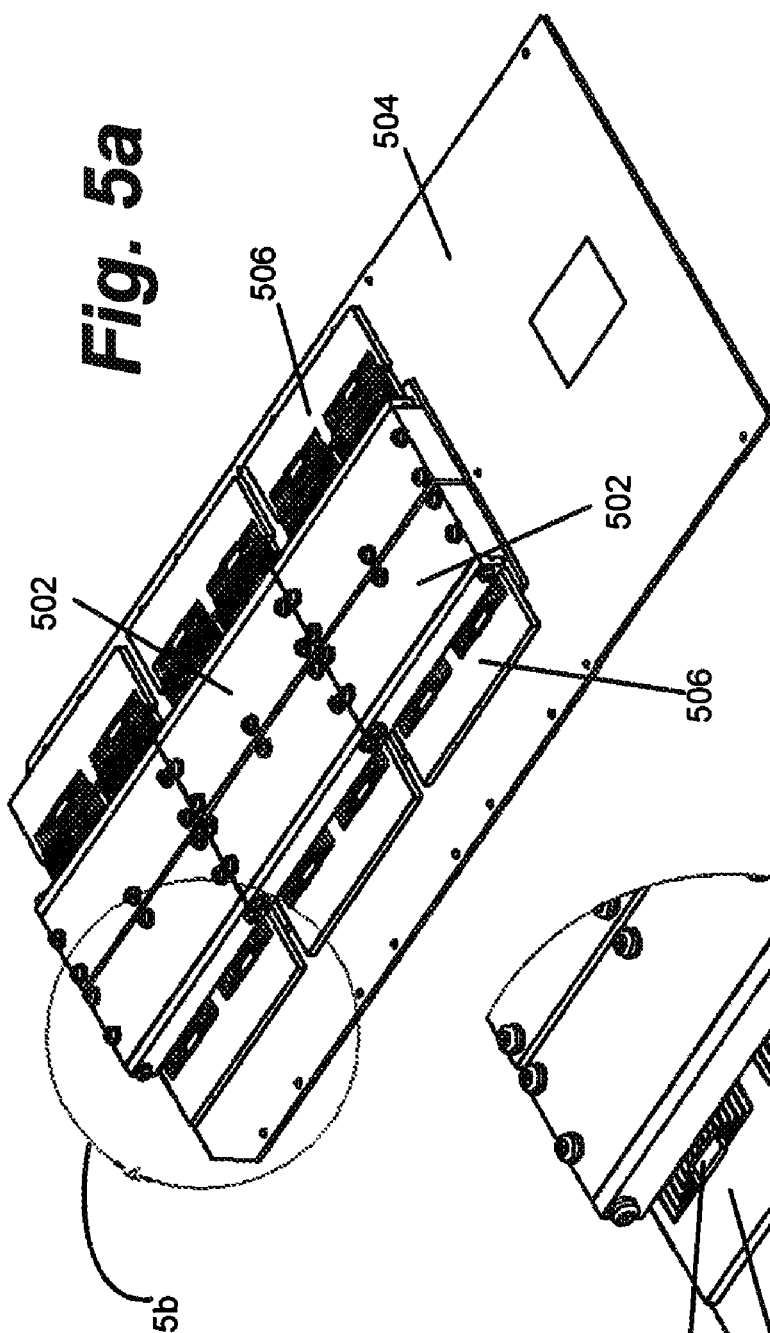
FIG. 5a illustrates a system in which a socket is attached to a DUT board, and a strip-shaped package is inserted into the socket.
Figure 5B:
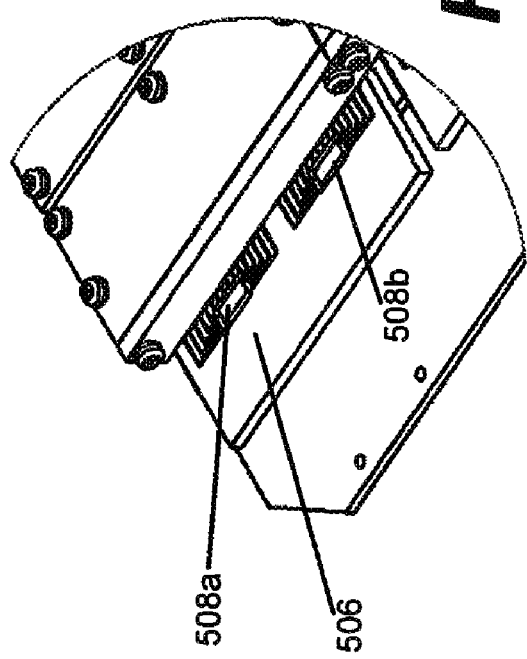
FIG. 5b is a zoom-in view of a portion of FIG. 5a, showing a package inserted into the socket, and also showing two dice bonded to the package.

FIG. 5a illustrates a system in which a socket 502 is attached to a DUT board 504, and a strip-shaped package 506 is inserted into the socket 502. The DUT board 504 includes two such socket 502 and package 506 combinations. FIG. 5b is a zoom-in view of a portion of FIG. 5a, showing a package 506 inserted into the socket 502, and also showing two dice 508a and 508b bonded to the package 506.

Figure 6:
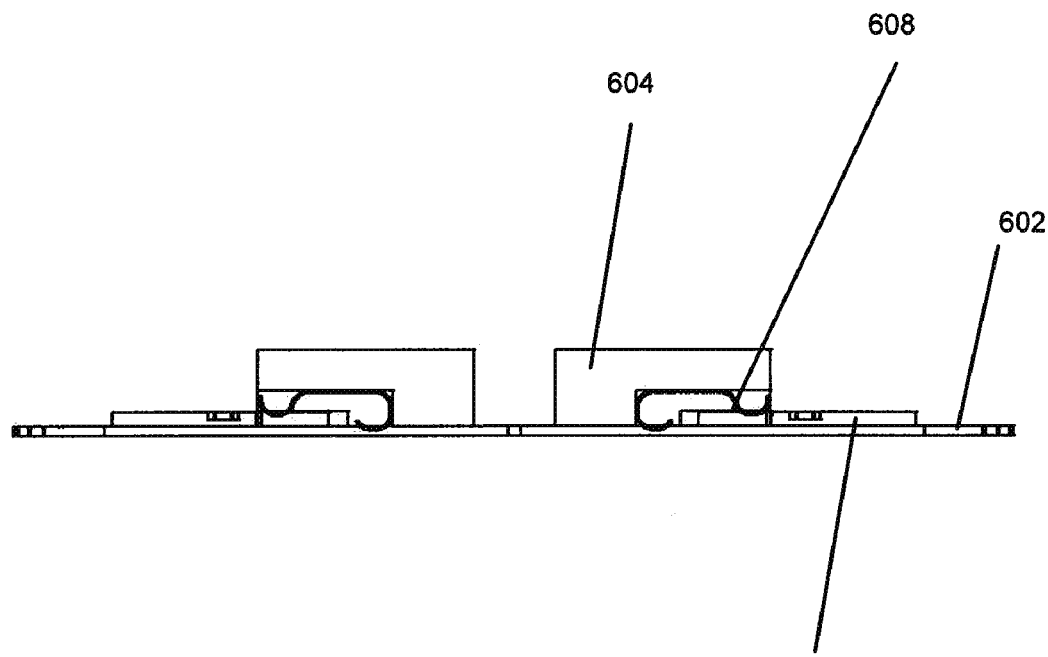
FIG. 6 illustrates an end view cut-away of a DUT board having a socket attached thereto, and also having a strip-shaped package inserted into the socket.

FIG. 6 illustrates an end view cut-away of a DUT board 602 having a socket 604 attached thereto, and also having a strip-shaped package 606 (for example, like the package 506 of FIG. 5) inserted into the socket 604. A spring wire 608 housed within the socket 604 not only facilitates a mechanical connection between the package 606 and the combination of the DUT board 602 and socket 604, but the spring wire 608 also provides an electrical path from a conduction path on the package 606 to a corresponding conduction path on the DUT board 602.

With the configuration in which the conduction paths on the package extend to the edge that is inserted into the socket, potentially fragile leads are not required. Rather, a more robust edge connector contact point is a continuous extension of the package.

While FIG. 6 illustrates a "ninety degree" type connection but, in some examples, the connection could be a vertical-type connection. Thus, for example, in the case of a vertical-type connection, the strip-shaped package stands perpendicular to the DUT board, rather than lying parallel to the DUT board. In examples of either case, the spring contact mechanism may be similar, as may be other aspects of the connecting and spacing mechanisms. With the vertical-type connection, the strip-shaped package may be utilized on both sides, since neither side would be lying flat against the DUT board.

An advantage to embodiments of the described socket and package system includes the ability to reuse the ceramic strips. If desired, the user may opt to remove the conduction paths from a package, having the conduction paths reprinted before bonding one or more new dice onto the package. The re-printing capability is facilitated due to the entire surface being at a uniform elevation and there being no leads to contend with. The portions of the conduction paths on the edge connector portion of a package are included what may be re-printed.

What is claimed is:

1. A system for parametric testing of at least one die, comprising:
   a board comprising electronics to interface the at least one die to electronics test equipment;
   a socket affixed to the board; and
   at least one package, wherein the at least one package comprises a substrate having a plurality of conductive paths formed integrally thereon, each of the plurality of conductive paths directly connecting a connection point on the at least one die to a corresponding point at an edge of the package,
   wherein
   the socket is configured to enable the at least one package to be inserted into the socket in an orientation substantially parallel relative to the board with the at least one package lying flat against the board,
   the at least one package and the socket are configured such that, when the edge of the package is inserted into a receptacle of the socket, contacts of the socket serve to both electrically connect the conductive paths on the package to respective conductive paths on the board and to mechanically couple the package to the board, and
   the socket includes a plurality of separators, each separator configured to accommodate a corresponding notch in an edge portion of the at least one package, so as to align the plurality of conductive paths on the edge of the packages to the conductive paths on the board.

2. The system of claim 1, wherein:
   the contacts include a plurality of conductive springs, each conductive spring serving to electrically connect an electronic lead on the at least one package to a respective conductive path on the board, the plurality of conductive springs collectively serving to mechanically couple the at least one package to the board.

3. The system of claim 1, wherein:
   the at least one die is a plurality of dice;
   the at least one package is a plurality of packages; and
   the plurality of packages is fewer packages than the plurality of dice, such that at least one of the plurality of packages is configured to accommodate more than one of the plurality of dice.

4. The system of claim 1, wherein:
the socket includes a plurality of separators, each separator configured to accommodate a notch in an edge portion of the at least one package, so as to align the plurality of conductive paths on the edge of the packages to the conductive paths on the board.

5. The system of claim 1, wherein:
the plurality of conductive paths formed integrally on the at least one package are printed on the at least one package to be formed integrally thereon.

6. The system of claim 1, wherein:
the at least one package is comprised of ceramic.

7. A method of configuring a system for parametric testing of at least one die, comprising:
providing a board comprising electronics to interface the at least one die to electronics test equipment;
providing a socket affixed to the board; and
providing at least one package, including forming a plurality conductive paths integrally thereon, each of the plurality of conductive paths from a connection point on the at least one die to a corresponding point at an edge of the package,
the method including providing the at least one package and the socket to be configured such that, when the edge of the package is inserted into a receptacle of the socket, contacts of the socket serve to both electrically connect the conductive paths on the package to respective conductive paths on the board and to mechanically couple the package to the board and the at least one package inserted into the socket is in an orientation substantially parallel relative to the board with the at least one package lying flat against the board,
wherein the socket includes a plurality of separators, each separator configured to accommodate a corresponding notch in an edge portion of the at least one package, so as to align the plurality of conductive paths on the edge of the packages to the conductive paths on the board.

8. The socket of claim 1, wherein:
the socket is characterized by at least one receptacle on a first side of the socket and at least one receptacle a second side of the socket, the second side of the socket opposing the first side of the socket; and
the socket is configured to enable at least some of the packages to be inserted into the at least one receptacle on the first side of the socket and to enable at least some of the packages to be inserted into the at least one receptacle on the second side of the socket.

\* \* \* \* \*